United States Patent [19]

Parks

[11] 4,005,407
[45] Jan. 25, 1977

[54] CATHODE RAY TUBE DIGITIZER

[75] Inventor: John D. Parks, Lorton, Va.

[73] Assignee: The United States of America as represented by the Secretary of the Army, Washington, D.C.

[22] Filed: May 8, 1975

[21] Appl. No.: 575,855

[52] U.S. Cl. .................................. 340/347 AD
[51] Int. Cl.$^2$ ................................ H03K 13/18
[58] Field of Search ............ 340/347 AD, 347 DD; 315/8.5; 328/123, 124

[56] References Cited

UNITED STATES PATENTS

| | | | |
|---|---|---|---|
| 2,632,147 | 3/1953 | Mohr | 340/347 AD |
| 2,848,605 | 8/1958 | Kuchinsky | 340/347 AD |
| 2,997,541 | 8/1961 | Grottrup | 340/347 DD |
| 3,064,894 | 11/1962 | Campbell | 340/347 DD |
| 3,237,185 | 2/1966 | Yen | 340/347 DD |
| 3,845,290 | 10/1974 | Reitsma | 340/347 DD |

*Primary Examiner*—Charles D. Miller
*Attorney, Agent, or Firm*—Nathan Edelberg; Robert P. Gibson; Saul Elbaum

[57] ABSTRACT

A conventional CRT is modified to include a vertical column of electrodes embedded in the face of the CRT. A single valued function is displayed on the CRT and the vertical and horizontal gains are adjusted to produce the desired sweep on the face of the CRT. The horizontal sweep is then disabled and the sweep is compressed to a single axis, coincident with the column of electrodes. The electron beam, corresponding to the plot, generates signals on the electrodes which are encoded to binary outputs. By continually decoding each three consecutive outputs, corresponding points of the plot are determined.

7 Claims, 4 Drawing Figures

CATHODE RAY TUBE DIGITIZER

RIGHTS OF THE GOVERNMENT

The invention described herein may be manufactured, used, and licensed by or for the U.S. Government for governmental purposes without the payment to me of any royalty thereon.

BRIEF DESCRIPTION OF THE PRIOR ART

In the past, in order to perform data processing of single valued analog signals, manual methods have been employed to determine the amplitude of various points on a plot, shown in an oscilloscope photo, which were then reduced to digital form. One example of such a device is known as the Gerber Scale, manufactured by the Gerber Scientific Company, Hartford, Conn. The device includes a precision spring having alternately colored turns thereon. By stretching the spring from a baseline of the plot to various ordinate points, distance is measured, corresponding to amplitude. As will be appreciated, the results are coarse and the method is extremely inconvenient to use.

BRIEF DESCRIPTION OF THE PRESENT INVENTION

The present invention does away with the necessity of photographing the analog plot for purposes of performing mechanical measurements. Instead, a special purpose CRT is utilized. The CRT has a vertical column of electrodes embedded in the face thereof. An analog plot is displayed on the face of the CRT for purposes of adjusting vertical-horizontal gains. Then, the horizontal sweep is disabled so that only a vertical trace, coincident with the column of electrodes, occurs. As various points of the analog signal are generated by the CRT, correspondingly positioned electrodes are energized. The electrodes are connected to logic circuits for reducing the outputs of the electrodes to an eight-bit binary word. By comparing the changes of the binary words during three sequential intervals, the corresponding point on the plot may be determined. By storing the eight-bit words, as they change, the analog signal has been digitized for purposes of data processing. However, it should be stressed that the actual data processing after digitization is not the subject matter of the present invention.

The above-mentioned objects and advantages of the present invention will be more clearly understood when considered in conjunction with the accompanying drawings, in which:

DETAILED DESCRIPTION OF THE PRESENT INVENTION

Figure 1:
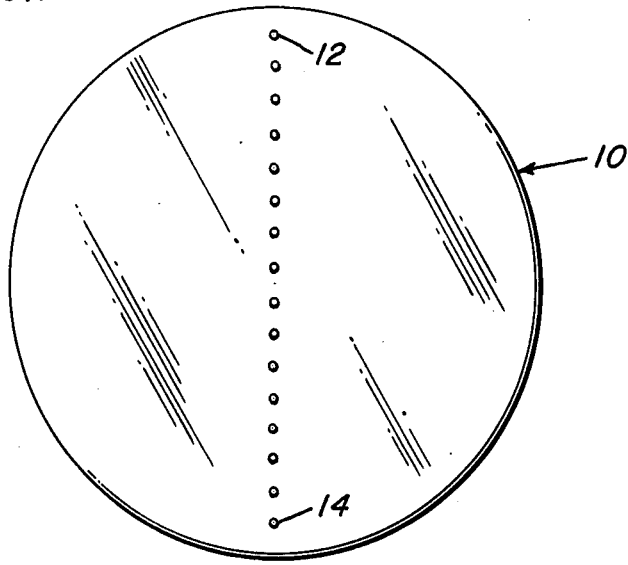
FIG. 1 is a front elevational view of a special purpose CRT, as utilized in the present invention.
Figure 2:
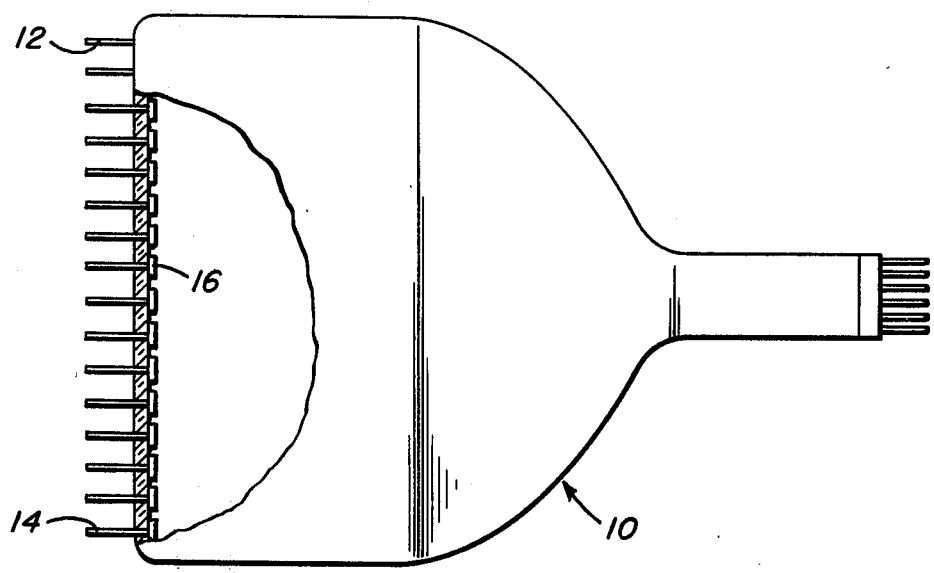
FIG. 2 is a side elevational view of the CRT shown in FIG. 1.

FIGS. 1 and 2 illustrate a specially modified CRT 10 which quantizes a single valued function analog plot. Initially, the analog plot is displayed on the face of the CRT in the normal manner. This permits the gain controls of the vertical and horizontal deflection circuits to be adjusted for proper gain. This is in accordance with normal utilization of oscilloscopes and CRTs.

A single vertical column of electrodes protrudes outwardly from the face of the tube. The uppermost positioned electrode is indicated by 12 while the lowermost positioned electrode is indicated by 14. In the preferred embodiment of the present invention 81 electrodes are employed, although far fewer electrodes are illustrated in FIGS. 1 and 2, for purposes of convenience.

In FIG. 2, the electrodes are seen to extend inwardly through the face of the CRT 10 and terminate in metallic conductors or patches 16. Thus, as an electron beam hits a particular patch, an electrical output signal will be developed on a corresponding electrode.

After the analog plot is adjusted for gain, the horizontal sweep is disabled so that a single trace will fall coincident with the vertical column of electrodes. This in effect compresses the analog plot to a single axis. The amplitude of various points along the plot will be sensed by correspondingly positioned electrodes.

Figure 3:
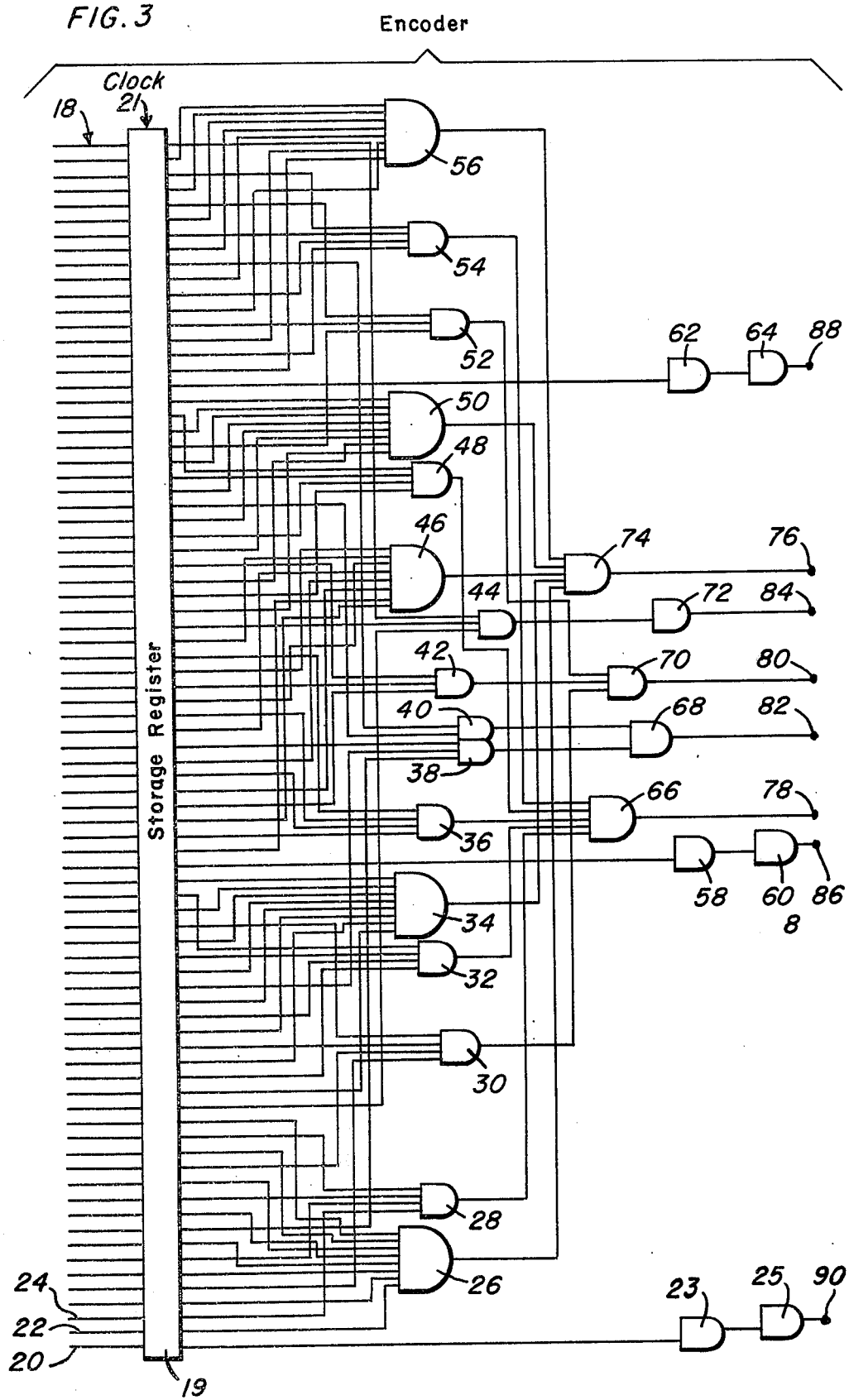
FIG. 3 is a logic diagram showing the encoding of signals from the electrodes to an eight-bit output which is the result of digitization.

FIG. 3 illustrates the OR gate circuitry that is connected to the outwardly protruding electrodes. The set of electrodes, actually being 81 in number, are generally indicated by reference numeral 18. Opposite ends of the electrodes are connected to a storage register 19, of conventional design. The register is of the latching type which loads a binary one into those stages of the register associated with an electrode that has been energized by electron beam impingement. A clock 21 is provided to unload the contents of the storage register into the illustrated gating circuits at a frequency, typically less than or equal to 500 MHz. The gating circuits connected to the output of register 19 effectively encode the output from the storage register to an eight-bit binary word present at outputs 76, 78, 80, 82, 84, 86, 88 and 90. At any given instant of time, only one of the eight outputs is set to a binary one state, while the remaining are at a binary zero state. In order to determine exactly which of the register outputs has been energized, means are provided for recording the outputs as they change. By detecting the changes of the outputs during three consecutive intervals, a unique condition is developed that defines which register output has been energized.

The relationship between the first level of logic in the encoder and the storage register outputs are as follows.

| GATE | INPUT TO GATE FROM STORAGE REGISTER 19 OUTPUTS |
|---|---|
| 23–25 (Double Inverters) | 1 (Lowest Positioned Output) |
| 26 | 16, 14, 12, 10, 8, 6, 4, 2 |
| 28 | 15, 11, 7, 3 |
| 30 | 29, 21, 13, 5 |
| 32 | 31, 27, 23, 19 |
| 34 | 32, 30, 28, 26, 24, 22, 20, 18 |
| 36 | 47, 43, 39, 35 |
| 38 | 41, 25, 9 |
| 40 | 73, 57 |
| 42 | 53, 45, 37 |
| 44 | 81, 49, 17 |
| 46 | 46, 48, 44, 42, 40, 38, 34, 36 |
| 48 | 63, 59, 55, 51 |
| 50 | 64, 62, 60, 58, 56, 54, 52, 50 |
| 52 | 77, 69, 61 |
| 54 | 79, 75, 71, 67 |
| 56 | 80, 78, 76, 74, 72, 70, 68, 66 |
| 58–60 (Double Inverters) | 33 |

| GATE | INPUT TO GATE FROM STORAGE REGISTER 19 OUTPUTS |
| --- | --- |
| 62–64 (Double Inverters) | 65 |

The following tabulation pertains to the second level of logic including gates that operate upon the outputs of the previously tabulated gates in the first level of logic.

| GATE | INPUTS DERIVED FROM GATES |
| --- | --- |
| 66 | 54, 48, 36, 32, 28 |
| 68 | 40, 38 |
| 70 | 52, 42, 30 |
| 72 | 44 |
| 74 | 56, 50, 46, 34, 26 |

The eight-bit binary output from the circuitry shown in FIG. 3 is tabulated next to respective gates as follows:

| OUTPUT | GATE FROM WHICH DERIVED |
| --- | --- |
| 76 | 74 |
| 78 | 66 |
| 80 | 70 |
| 82 | 68 |
| 84 | 72 |
| 86 | 60 |
| 88 | 64 |
| 90 | 25 |

Referring to the input electrode group 18, the lowest three positioned electrodes are indicated as 20, 22 and 24, respectively. Electrode 20 was indicated as 14 in FIGS. 1 and 2. Electrode 20 corresponds with the lowest output from storage register 19 while the second lowest positioned electrode 22 corresponds with the second lowest output from storage register 19, etc. It is important to note that no two consecutively positioned electrodes are fed to the same gate in the first level of logic. Thus, electrode 20 passes through to gate 23 while the next consecutively positioned electrode 22 passes through to gate 26. Electrode 24 passes through to gate 28.

Figure 4:
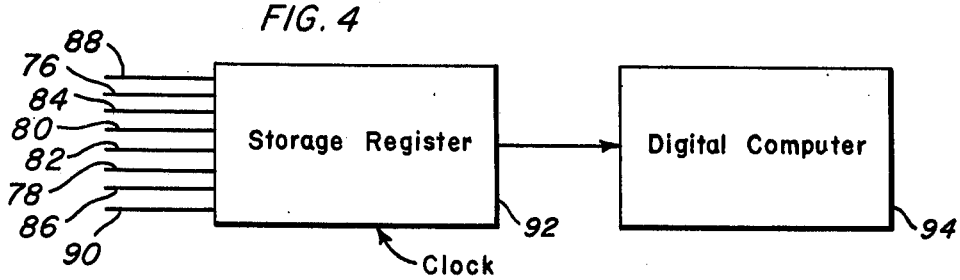
FIG. 4 is a block diagram illustrating data handling of the binary outputs from the circuitry of FIG. 3.

Referring to FIG. 4, a storage register 92 records the eight-bit output from output leads 76, 78, 80, 82, 84, 86, 88 and 90. The clock to 92 must be at the frequency of the clock 21 (FIG. 3). Storage register 92 may be in the form of magnetic tape, a disc or other storage source. In order to define, at a particular instant, which of the electrodes was energized, the eight output leads going into storage register 92 must be investigated during three consecutive time intervals. Since the points along an analog single valued function plot varies continuously rather than discontinuously, consecutively positioned electrodes will be energized in turn as the amplitude of the analog plot varies. Thus, by correlating the changes of the eight-bit output during any three consecutive intervals, one is able to determine which electrode is energized during the middle interval. This is done simply with a conventional look-up table and is handled by a computer 94. The computer may also be programmed for purposes of analyzing the analog signal. However, this latter function is not the subject matter of the present invention.

Thus described, the advantages of the present invention over conventional digitizing techniques, using mechanical devices will be apparent.

I wish it to be understood that I do not desire to be limited to the exact details of construction shown and described, for obvious modifications can be made by a person skilled in the art.

Wherefore the following is claimed:

1. A CRT for digitizing a single valued function analog plot comprising:

a plurality of conductor means disposed along a single line across the inner surface of the tube face, against which an electron beam, inside the tube, impinges;

a corresponding number of electrodes protruding through the face of the tube, each electrode connected at an inward end thereof to respective conductor means, the electrodes individually transmitting digitized electrical signals to the exterior of the tube, when respective conductor means are impinged;

an encoding means connected to the outward ends of the electrodes which reduces the binary state of the electrodes by gating means to a digital output having binary bit positions fewer in number than the electrodes;

a first storage register connected between the electrodes and the encoding means for temporarily storing the outputs of the electrodes, prior to unloading to the encoding means;

a second storage register means connected to the output of the encoding means for temporarily storing the digital output thereof;

a clock means connected to the first storage means for sequentially unloading the register at a selected frequency;

a clock means connected to the second storage means for sequentially unloading the register at a frequency that is the same as the clock frequency of the first storage register; and a means connecting the output of the second storage register to a computer for comparing three consecutive outputs from the second storage register to a look-up table in a digital computer which determines the corresponding point on the plot;

wherefore, the digitized electrical signals relate to points along the analog plot.

2. The subject matter of claim 1 wherein the clock means connected to the first storage means for sequentially unloading the register is at a frequency in the MHz range.

3. The subject matter of claim 1 wherein the CRT is a conventional CRT with its horizontal sweep disabled.

4. The subject matter of claim 3 wherein the encoding means comprises "or" gate circuitry that is connected to the outwardly protruding electrodes.

5. The subject matter of claim 4 wherein the digital output of the encoding means is such that at any instant of time only one of the outputs is set to a binary one state, while the remaining are at a binary zero.

6. The subject matter of claim 5 wherein the digital output includes eight binary bit positions.

7. The subject matter of claim 5 wherein the electrodes are 81 in number.

* * * * *